United States Patent [19]

Yamaguchi et al.

[11] Patent Number: 4,983,540

[45] Date of Patent: Jan. 8, 1991

[54] METHOD OF MANUFACTURING DEVICES HAVING SUPERLATTICE STRUCTURES

[75] Inventors: Hiroshi Yamaguchi, Fujisawa; Keiya Saito, Yokohama; Fumikazu Itoh, Fujisawa; Koji Ishida, Musashino; Shinji Sakano, Hachiouji; Masao Tamura, Tokorozawa; Shoji Shukuri, Koganei; Tohru Ishitani, Sayama; Tsuneo Ichiguchi, Hachiouji, all of Japan

[73] Assignee: Hitachi, Ltd., Tokyo, Japan

[21] Appl. No.: 273,012

[22] Filed: Nov. 18, 1988

[30] Foreign Application Priority Data

Nov. 24, 1987 [JP] Japan .................................. 62-294061

[51] Int. Cl.$^5$ .................... H01L 21/20; H01L 21/265
[52] U.S. Cl. ........................... 437/110; 148/DIG. 46; 148/DIG. 51; 148/DIG. 84; 148/DIG. 160; 357/16; 437/25; 437/133; 437/225; 437/930; 437/936
[58] Field of Search ................. 148/DIG. 3, 4, 14, 23, 148/46, 50, 51, 56, 65, 72, 76, 84, 90, 94, 95, 110, 131, 160, 169, 33-33.2, 33.4-33.5; 156/610-614, 643, 644, 648, 662; 357/16, 17, 91, 55; 372/43, 45, 46, 48, 50; 437/22, 25, 24, 26, 81, 107, 108, 110, 111, 126, 129, 133, 225, 228, 247, 930, 934, 936, 987

[56] References Cited

U.S. PATENT DOCUMENTS

| | | | |
|---|---|---|---|
| 4,101,772 | 7/1978 | Konishi et al. | 204/192.34 |
| 4,457,803 | 7/1984 | Takigawa | 156/626 |
| 4,575,924 | 3/1986 | Reed et al. | 437/105 |
| 4,639,301 | 1/1987 | Doherty et al. | 156/643 |
| 4,771,010 | 9/1988 | Epler et al. | 437/129 |
| 4,783,427 | 11/1988 | Reed et al. | 437/110 |
| 4,800,100 | 1/1989 | Herbots | 437/250 |
| 4,843,032 | 5/1989 | Tokuda et al. | 437/110 |

FOREIGN PATENT DOCUMENTS 0201721 11/1986 European Pat. Off. .

OTHER PUBLICATIONS

Ishida et al., "Scan Speed ... GaAs–AlGaAs Superlattices by Focused Si Ion Beam Implantation," Appl. Phys. Lett., vol. 51, No. 2, Jul. 13, 1987, pp. 109–111.
Miyauchi et al., "Application of Focused Ion Beam Technology ... ", J. Vac. Sci. Technol. A, vol. 4, No. 3, May–Jun. 1986, pp. 933–938.
Patent Abstracts of Japan, vol. 11, No. 9 (P-534) (2456), Jan. 10, 1987.

Primary Examiner—Olik Chaudhuri
Assistant Examiner—William Bunch
Attorney, Agent, or Firm—Antonelli, Terry, Stout & Kraus

[57] ABSTRACT

An ion beam (113) focused into a diameter of at most 0.1 μm bombards substantially perpendicularly to the superlattice layers of a one-dimensional superlattice structure and is scanned rectilinearly in a direction of the superlattice layers so as to form at least two parallel grooves (108, 109, 110, 111) or at least two parallel impurity-implanted parts (2109) as potential barrier layers, whereby a device of two-dimensional superlattice structure can be manufactured. At least two parallel grooves (114, 115, 116, 117) or impurity-implanted parts are further formed orthogonally to the potential barrier layers of the two-dimensional superlattice structure, whereby a device of three-dimensional superlattice structure can be manufactured. In addition, deposition parts (2403, 2404, 2405) may well be provided by further depositing an insulator into the grooves (108, 109, 110, 111, 114, 115, 116, 117) which are formed by the scanning of the ion beam. Owing to these expedients, the portions of the two-dimensional and three-dimensional superlattice structures can be manufactured with ease and at high precision.

27 Claims, 15 Drawing Sheets

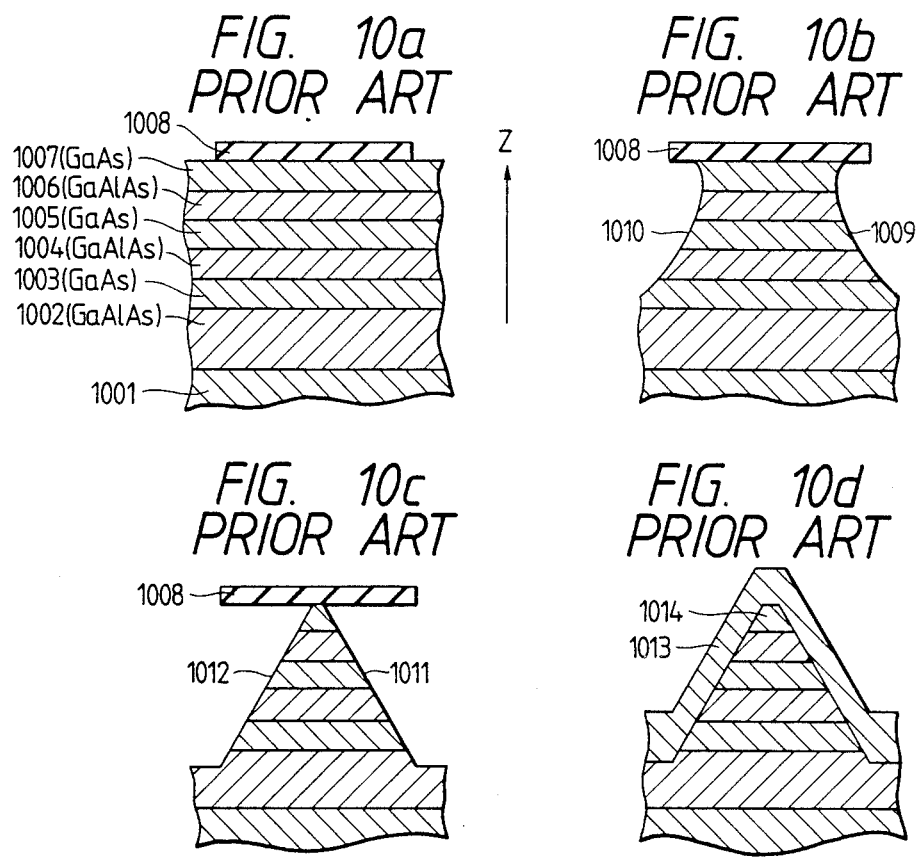
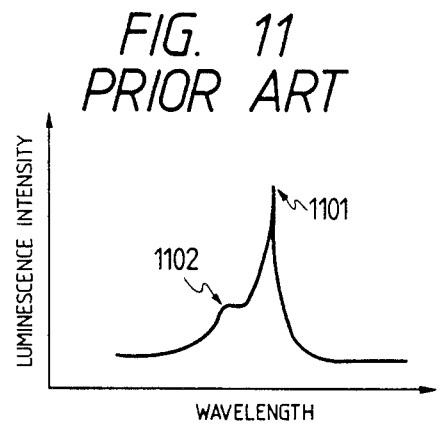

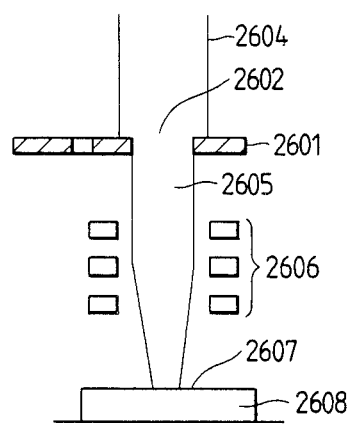
FIG. 26a
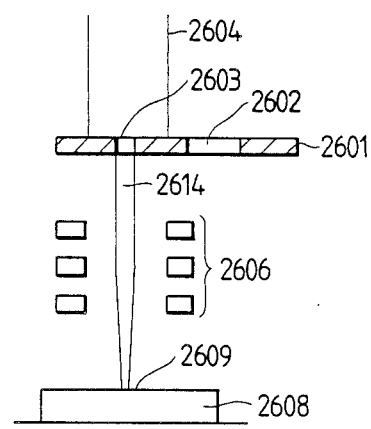
FIG. 26b
FIG. 27a
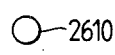
FIG. 27b
FIG. 28a
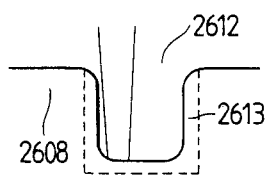
FIG. 28b
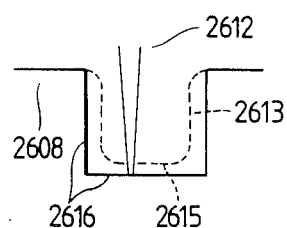

METHOD OF MANUFACTURING DEVICES HAVING SUPERLATTICE STRUCTURES

BACKGROUND OF THE INVENTION

The present invention relates to a two-dimensional superlattice structure (so-called quantum well wire) and a three-dimensional superlattice structure (so-called quantum well box) and devices, such as a HEMT (high electron mobility transistor), diode laser and OEIC (optoelectronic integrated circuit), employing them. It also relates to a method of and apparatus for manufacturing such a device.

Heretofore, a one-dimensional hetero-superlattice structure as shown in FIG. 2 by way of example has been known.

The one-dimensional superlattice structure is so constructed that, on a substrate 201 of GaAs, several layers of GaAlAs 202, 204, 206 and 208 and several layers of GaAs 203, 205 and 207 are alternately grown in a z-direction by, e.g., molecular beam epitaxy (MBE), or chemical vapor deposition (MOCVD) or molecular beam epitaxy (MOMBE) employing an organometallic compound. In the superlattice of such a construction, conduction bands and valence bands of different levels are alternately arrayed as illustrated in FIG. 3 because the electron affinity and the energy gap differ between GaAs and GaAlAs. Thus, in case of x=0.25 by way of example, the bottom of the conduction band of $Al_x$-$Ga_{1-x}As$ is 0.3 eV higher than that of the conduction band of GaAs, and the top of the valence band of $Al_x$-$Ga_{1-x}As$ is 0.06 eV lower than that of the valence band of GaAs, thereby to form a well-type potential in which GaAs defines wells and AlGaAs defines barriers as shown in FIG. 3. Here, when the composition ratio x of Al is varied, the height of the barriers is proportional to x.

The above is the one-dimensional superlattice structure, namely, quantum well. When the barriers are sufficiently wide, electrons are confined within the potential wells and are localized. In contrast, when the barriers are narrow, electrons form small minibands (subbands) within the conduction bands and can move about within the superlattice.

With such a one-dimensional quantum well structure, a state density curve which expresses the state density D(E) of electrons versus energy becomes stepped as indicated by a solid line in FIG. 5, unlike a parabolic state density curve in the case of a bulk as shown in FIG. 4.

As stated above, the one-dimensional superlattice has the very artificial structure and exhibits the special energy density structure. In semiconductor lasers, FETs (field effect transistors), etc. employing this superlattice, therefore, excellent characteristics unattainable with a conventional structure of the bulky type have been attained.

In, for example, the semiconductor lasers, there have been achieved such excellent effects compared with the bulky type as (1) decrease in the threshold value of an injection current, (2) improvement in output stability for the temperature change, (3) increase in a gain, and (4) rise in a response rate.

Concerning such one-dimensional superlattice, two-dimensional and three-dimensional superlattice structures have been suggested as ideas, and the characteristics thereof have been theoretically computed.

The ideas of the two-dimensional and three-dimensional superlattice structures are described in, for example, 'H. Sakai; Japanese Journal of Applied Physics, vol. 19 (1980), No. 12, pp. L735-L738' and 'Y. Arakawa and H. Sakai; Appl. Phys. Lett., vol. 40 (1982), pp. 939-941.'

A two-dimensional superlattice (Quantum Well Line or Quantum Well Wire) shown in FIG. 6 is such that the foregoing structure, in which the layers of the two sorts of materials are stacked in the z-direction, is formed with periodic potential barriers 601 and 602 also in a y-direction. A three-dimensional superlattice structure (Quantum Well Box or Quantum Well Dot) shown in FIG. 7 is such that, besides periodic potential barriers 701 and 702 in the y-direction, periodic potential barriers 711 and 712 are formed in an x-direction.

Here, the potential barriers 601, 602, 701, 702, 711, 712 . . . etc. in the x-direction and y-direction need not be stacked into the alternate layers of the different materials GaAs and GaAlAs as in the z-direction, but they may well be formed by making spatial gaps.

State density curves corresponding to the two-dimensional and three-dimensional superlattices in FIGS. 6 and 7 become as illustrated in FIGS. 8 and 9, respectively. From the respective curves, there are seen situations in which electrons are localized in one dimension and zero dimension, whereby the state densities thereof concentrate in still smaller regions of energy. It is therefore predicted that, in semiconductor lasers employing these superlattices, the features (1)–(4) as mentioned above will be further improved.

For such two-dimensional and three-dimensional superlattice structures, however, there has hitherto been no suitable method of manufacture. This is because there has been no means to form narrow alternate potential wells and barriers in x- and y- directions onto the superlattice having z- directional laminated structure.

As one of few experimental examples reported, the attempt by Petroff et al is illustrated in FIGS. 10a-10d. This is described in 'Physics and Application of Semiconductor Superlattice' edited by the Physical Society of Japan, pp. 85-87 (1984) or 'P. M. Petroff et al; Appl. Phys. Lett.,' 41 (1982), pp. 635-638. In this example, a one-dimensional superlattice, in which $Ga_{0.75}Al_{0.25}As$ 1002, GaAs 1003, $Ga_{0.75}Al_{0.25}As$ 1004, GaAs 1005, $Ga_{0.75}Al_{0.25}As$ 1006 and GaAs 1007 are grown in alternate fashion on a GaAs substrate 1001 by an expedient (or means) such as molecular beam epitaxy, has its uppermost layer coated with a photoresist, which is exposed to light and then developed using a mask formed by an expedient such as electron beam lithography, whereby a stripe-like resist layer 1008 having a width of about 2 μm is left as shown in FIG. 10a. Here, the lengthwise direction of the stripe is perpendicular to the sheet of the drawing.

Thereafter, when the resulting structure is subjected to chemical etching, even a part under the resist layer is obliquely etched as indicated by numerals 1009 and 1010 in FIG. 10b owing to the presence of the stripe-like resist layer. The etching can be ended so as to finally leave the materials of trapezoidal or triangular section 1011, 1012 as shown in FIG. 10c. Thereafter, the remaining resist 1008 is stripped off, and a film 1013 of $Al_{0.31}Ga_{0.69}As$ having a great energy gap is formed for protection on the whole surface of the resulting structure as shown in FIG. 10d by molecular beam epitaxy or the like.

The structure thus manufactured becomes a multilayer wire structure in which the lateral dimensions of the respective layers in its section are different. The sectional dimensions of the quantum well wire 1014 of the uppermost layer can be made about 200 Å×200 Å, of which the quantum effect of the two-dimensional superlattice can be expected. The measurement of cathode luminescence at a low temperature (about 20 K) has revealed that, as shown in FIG. 11, besides a peak 1101 from the original one-dimensional superlattice, the peak 1102 of new luminescence based on the two-dimensional quantum effect is obtained on the shorter wavelength side.

However, the prior-art method of manufacturing the two-dimensional superlattice (quantum well wire) by Petroff et al as stated above has had the following disadvantages:

(1) With a quantum well wire whose respective layers have the same width, the peculiar potential as shown in FIG. 8 appears clearly owing to the effect of periodicity. In contrast, since the Petroff et al two dimensional superlattice has the triangular section, the widths of the respective layers differ from one another, so that the effect of periodicity is difficult to develop, and the essential characteristics of the two-dimensional quantum well wire are difficult to appear.

(2) Although the oblique etching under the resist layer is employed, the control of the sectional shape with this method is considerably difficult, and hence, the control of the layer widths of the quantum well wire is difficult.

(3) By repeating such patterns in the lateral direction, a multi-quantum well wire can be formed. However, it is difficult to render the intervals of the patterns less than several $\mu$m, and the effect of multiplicity (periodicity) is difficult to develop.

(4) In order to vary the pitch of the superlattice, the space between the neighboring grooves thereof, the groove width thereof, and the depth thereof (in the z-direction) as desired in accordance with a purpose or intended characteristics, tools including a mask pattern etc. need to be remade, and much labor and a long time are expended.

(5) Alternatively, the pattern can be formed without employing the mask and by exposing the resist layer with direct electron beam lithography. In this case, the pitch, space, groove width etc. of the superlattice as mentioned in Item (4) can be varied comparatively easily. Even in this case, however, the processes of resist patterning and etching are employed, so that the control of the above parameters at high precision is difficult, and much labor is required.

Besides, regarding the manufacture of the two-dimensional or three-dimensional quantum well, it is possible to mention the techniques of the official gazettes of Japanese Patent Applications Laid-open No. 250684/1985 and No. 222190/1986 employing an etching process, No. 42481/1987, No. 36886/1987 and No. 108592/1987 employing ion-implantation by a focused ion beam, and No. 89383/1987 employing a special expedient for molecular beam epitaxy.

SUMMARY OF THE INVENTION

An object of the present invention is to solve the problems of the prior-art techniques mentioned above, and to provide a method of manufacturing a two-dimensional or three-dimensional quantum well structure having excellent characteristics or a device of superlattice structure at high precision and with ease.

In the present invention, an ion beam from a high brightness ion source (for example, a liquid metal ion source or a very-low-temperature field ionization type ion source) is focused into an ultrafine beam having a diameter of 0.1 $\mu$m or less, especially about 0.05 $\mu$m or less by an ion beam optical system such as electrostatic lenses. The focused beam bombards a one-dimensional quantum well, for example, a portion where layers of GaAs and GaAlAs are stacked, so as to form the portion with at least two grooves or implant it with an impurity, whereby the portion is divided into a large number of fine wire parts to form a two-dimensional quantum well. Further, the resulting structure is formed with at least two grooves or implanted with the impurity in a direction orthogonal to the direction of the above projection of the focused beam, whereby the portion is divided into a checkered pattern to form a three-dimensional quantum well. In this way, the object of the present invention can be accomplished.

More specifically, the method of the present invention for manufacturing a superlattice structure or a device of superlattice structure comprises the steps of focusing an ion beam from an ion source of high brightness into an ultrafine spot having a diameter of 0.1 $\mu$m or less by the use of an ion beam optical system such as electrostatic lens, and bombarding the one-dimensional heterosuperlattice layers by the focused ion beam while rectilinearly scanning in the direction of one-dimensional heterosuperlattice layers, so as to form at least two grooves or to implant an impurity in the shape of grooves, thereby to form potential barriers. Alternatively, an insulator is deposited in the grooves formed as described above, by ion beam-induced CVD (chemical vapor deposition).

The grooves or the groove-shaped impurity-implanted portions are usually deep down to a substrate, but this is not restrictive.

The ion beam bombards usually in a direction substantially vertical to the one-dimensional superlattice layers as far as the ion beam system is possible.

The combination of the materials of the one-dimensional superlattice structure, namely, the combination of the material of well layers and that of barrier layers may be GaAs/Al$_x$Ga$_{1-x}$As, or a group-III-V compound system of good lattice matching, for example, GaP/GaAs$_x$P$_{1-x}$, GaAs/In$_x$Ga$_{1-x}$As, In$_x$Ga$_{1-x}$As/In$_y$Al$_{1-y}$As, or InP/Ga$_x$In$_{1-x}$As$_y$P$_{1-y}$. Further, the combinations of the materials of group-II-VI compounds of good lattice matching are possible. As the material of the substrate, the material of the well layers is usually used, but another material which has a good lattice matching with the one-dimensional superlattice can also be used.

When the one-dimensional superlattice is constructed of well layers of GaAs and barrier layers of GaAlAs, it is common to set the thickness of each well layer at 300 Å or less, more preferably at 200 Å or less, and most preferably at 100 Å or less. The same applies to the width of each well layer of the two-dimensional superlattice, and the length of each of the edges of each well part of the three-dimensional superlattice. In general, accordingly, limitations to the thickness and width of the well layer of the two-dimensional superlattice and to the length of each edge of a hexahedron functioning as the well part of the three-dimensional superlattice are substantially the same as a limitation to the thickness of the well layer of the one-dimensional superlattice which is made of the combination of materials identical to those of the two-dimensional and three-dimensional superlattices.

Incidentally, the one-dimensional superlattice structure which is used as a blank in the present invention is not restricted to the aforementioned examples, but it may be any of one-dimensional superlattice structures including hitherto-known ones, which can be formed with grooves or implanted with impurity ions by the bombardment of an ion beam.

The potential barrier part of each of the one-, two- and three-dimensional superlattice structures is not especially subject to the limitations of sizes. However, in a case where the superlattice structure is built in a device, the sizes of the barrier part might be limited by conditions peculiar to the device.

At least one potential well may be comprised in each superlattice structure, and the number of the potential wells is not especially subject to an upper limit.

The diameter of the focused spot of the ion beam for use in the present invention is set at 0.1 $\mu$m or less, more preferably at 0.05 $\mu$m or less, as mentioned above. When the spot diameter is larger, unfavorably the side walls of the formed grooves tend to become dull at and near the corners thereof, and an angle defined between the side wall of the groove and the one-dimensional superlattice layers tends to somewhat deviate from perpendicularity. Also for the purpose of establishing an accuracy of finishing nearly equal to the size (300 Å or less) of the well part or a still higher accuracy, the spot diameter of the ion beam should desirably be set at 0.1 $\mu$m or less, and at 0.05 $\mu$m or less if possible.

In the present invention constructed as described above, the high brightness ion source is such that the ions of a material to be ionized are extracted at a high current density from the end of a needle-like tip. Therefore, when the extracted ions are focused by the ion beam optical system such as electrostatic lens, they can be focused into a very small spot and can afford a sufficient current.

Especially when two or three or more lenses are employed as the electrostatic lens, large magnifications can be set, and in case of using the liquid metal ion source, an ultrafine beam having a diameter of 0.1–0.05 $\mu$m or less can be obtained.

Particularly when the field ionization type ion source in a gas phase at a very low temperature is employed as the ion source, the ion beam can also be focused into a diameter of 10 nm or less for such reasons that, unlike the liquid metal ion source, a Taylor cone of several tens nm is not formed at the tip of a needle, and that the energy width which is a factor determining the diameter of the focused spot is about 0.1 eV which is, at least, one order smaller than in the case of the liquid metal ion source. Further, since the ion beam can be deflected at high precision by means of deflecting electrodes as well as a control system therefor, the groove width, depth, groove space etc. of the quantum well can be controlled as desired and at high precision. In addition, the widths of the individual layers can be fixed, and the spacing of the wells can be formed in the submicron order.

As the element of the ion source, Ga is used oftenest. Besides, any of elements such as In, Si, Sn, Bi, Pb, Ni, Al, Au and Cu is used. Also, any of alloys such as AuSiBe, AlSi, PdNiSiBeB, CuP, SnPbAs, AuSb and AuSi is used. Any other material may well be employed if a favorable result has been experimentally obtained.

BRIEF DESCRIPTION OF THE DRAWINGS

FIGS. 10a–10d are sectional views showing a prior-art process for manufacturing a two-dimensional quantum well structure;

FIG. 11 is a graph showing the luminescence intensity spectrum of the two-dimensional quantum well structure shown in FIG. 10d;

FIGS. 26a, 26b, 27a, 27b, 28a and 28b are explanatory views showing a process for changing the diameter of an ion beam in the formation of a groove by the ion beam.

DESCRIPTION OF THE PREFERRED EMBODIMENTS

Figure 1A:
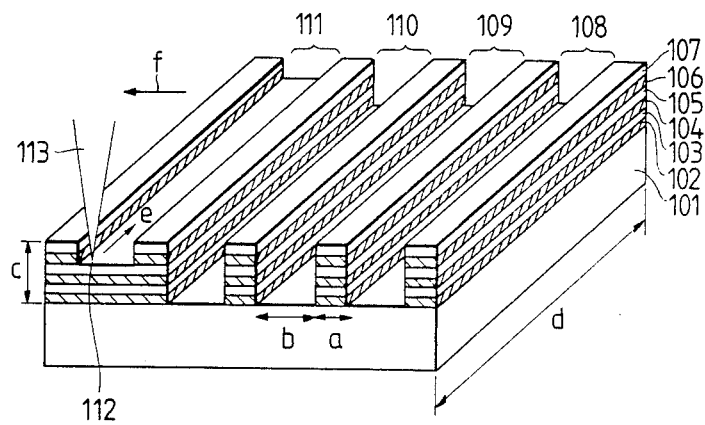
FIG. 1a is a perspective view showing a process for manufacturing a two-dimensional multi-quantum well structure (multi-quantum well wire) in an embodiment of the present invention.

FIG. 1a shows an example of a method of manufacturing a two-dimensional superlattice according to the present invention. A one-dimensional superlattice is such that, on a GaAs substrate 101, epitaxial layers which consist of several layers - several hundred layers of well layers (GaAs layers) and potential barrier layers (GaAlAs layers) are grown alternately as a GaAlAs layer 102, a GaAs layer 103, a GaAlAs layer 104, a GaAs layer 105, a GaAlAs layer 106 and a GaAs layer 107 (in which any of the GaAs layers is about 60 Å thick, and any of the GaAlAs layers is about 80 Å thick) by molecular beam epitaxy, MOCVD or the like. An ion beam 113 from a high-brightness ion source at an output of 1 $\mu$A-10 $\mu$A, such as liquid metal ion source or very-low-temperature field ionization type ion source, is focused into a spot 112 having a diameter of 0.1 $\mu$m or less by an electrostatic lens and bombards the one-dimensional superlattice while being deflected for scanning, whereby the one-dimensional superlattice is sputter-processed from its front surface so as to form grooves 108, 109, 110 and 111. The groove 111 is in the course of the processing. Here, approximate dimensions are that the width a of each part left by the processing is several tens nm, that the width b of each groove is several tens nm, that the thickness c of the heteroepitaxial layers is about 70 nm, and that the length d of each groove is several hundred $\mu$m or greater. By fining the ion beam down to about 50 nm here, the accuracy of the finished groove can be attained to within 10 nm. In addition, a very sharp edge shape is obtained by the sputtering which features the ion beam process. In the figure, the ion beam 113 is moved in a direction f while scanning in a direction e at a speed of 0.1 $\mu$m/sec.-100 $\mu$m/sec., thereby to perform planar scanning, and it is forming the groove 111 by repeating such operations. As the repeated scanning method, however, various different methods are possible. By forming a large number of grooves of several tens or more laterally in this manner, the two-dimensional superlattice quantum well wire can be formed. That is, in this case, the grooves formed by the ion beam 113 serve as potential barriers The degree of the localization of electrons in the quantum wire can be varied by changing the groove width b.

Figure 1B:
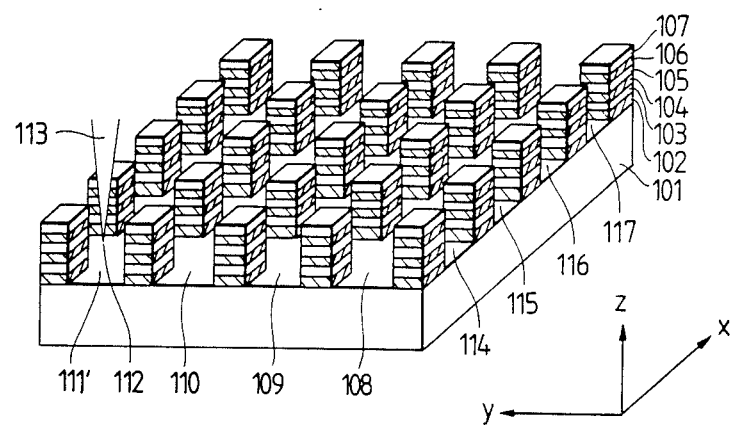
FIG. 1b is a perspective view showing a process for manufacturing a three-dimensional multi-quantum well structure (multi-quantum well dot) in another embodiment of the present invention.
Figure 2:
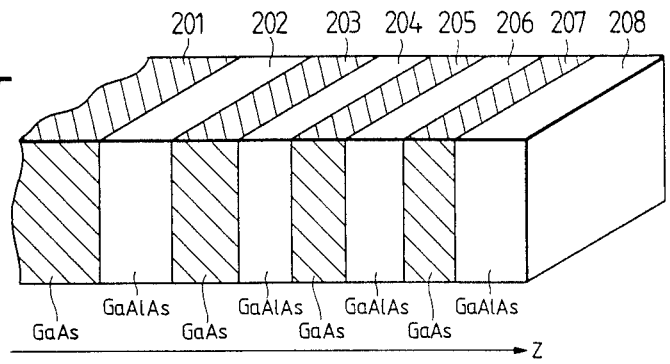
FIG. 2 is a perspective view showing a one-dimensional multi-quantum well structure in a prior art.
Figure 3:
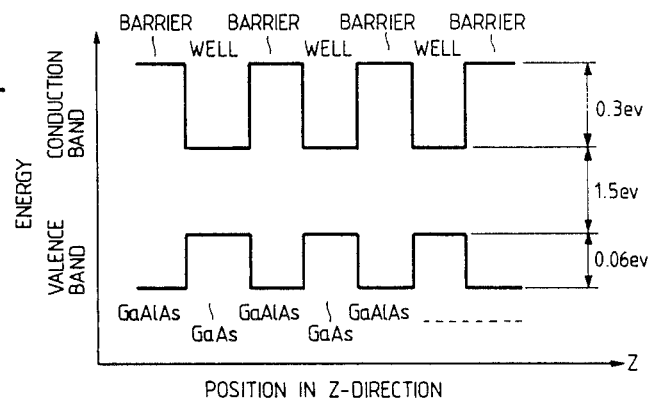
FIG. 3 is a graph showing the variations of potentials dependent upon positions, in the one-dimensional multi-quantum well structure shown in FIG. 2.
Figure 4:
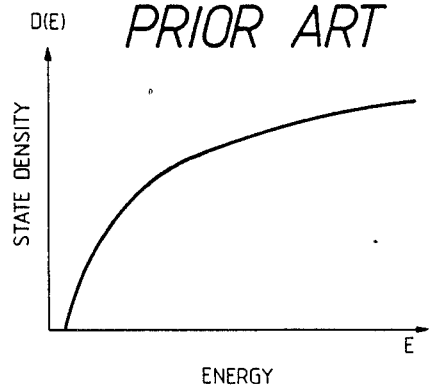
FIG. 4 is a graph showing the state density curve of a bulky type device.
Figure 5:
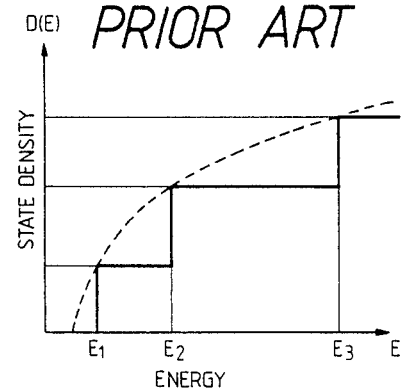
FIG. 5 is a graph showing the state density curve of the one-dimensional multi-quantum well structure.
Figure 6:
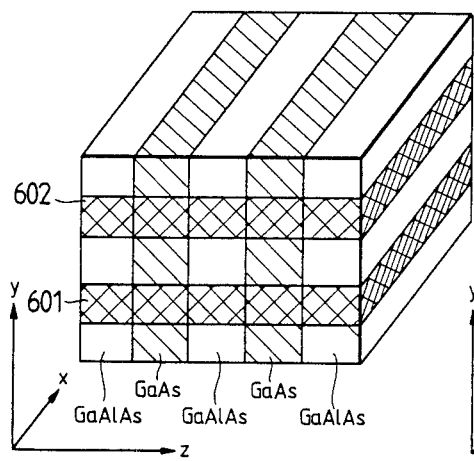
FIG. 6 is a perspective view showing an example of a two-dimensional multi-quantum well structure.
Figure 7:
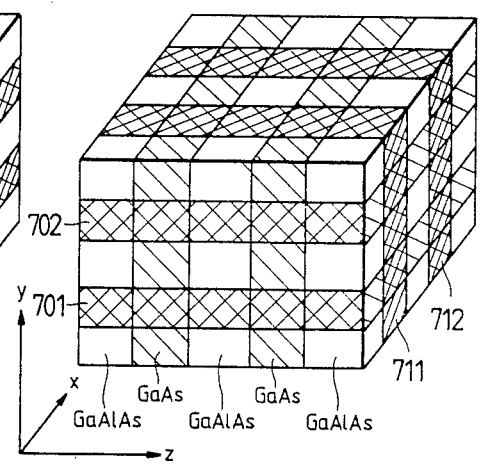
FIG. 7 is a perspective view showing an example of a three-dimensional multi-quantum well structure.
Figure 8:
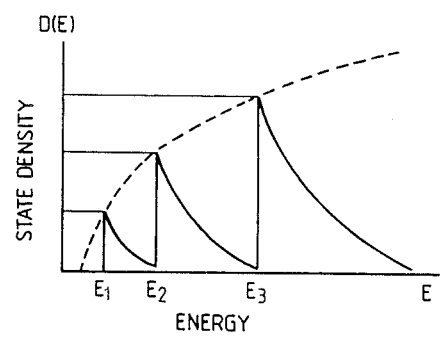
FIG. 8 is a graph showing the state density curve of the two-dimensional multi-quantum well structure shown in FIG. 6.
Figure 9:
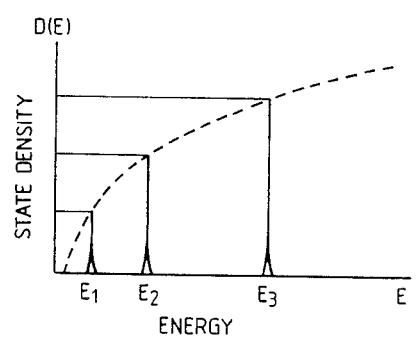
FIG. 9 is a graph showing the state density curve of the three-dimensional multi-quantum well structure shown in FIG. 7.

FIG. 1b shows a structure in which grooves 114, 115, 116 and 117 are further formed in a direction orthogonal to the grooves 108, 109, 110 and 111' formed in the above way, by the focused ion beam. Since the structure has potential barriers in the two orthogonal directions within the lamination of the epitaxial layers, it can form a three-dimensional superlattice (quantum well box).

Figure 12:
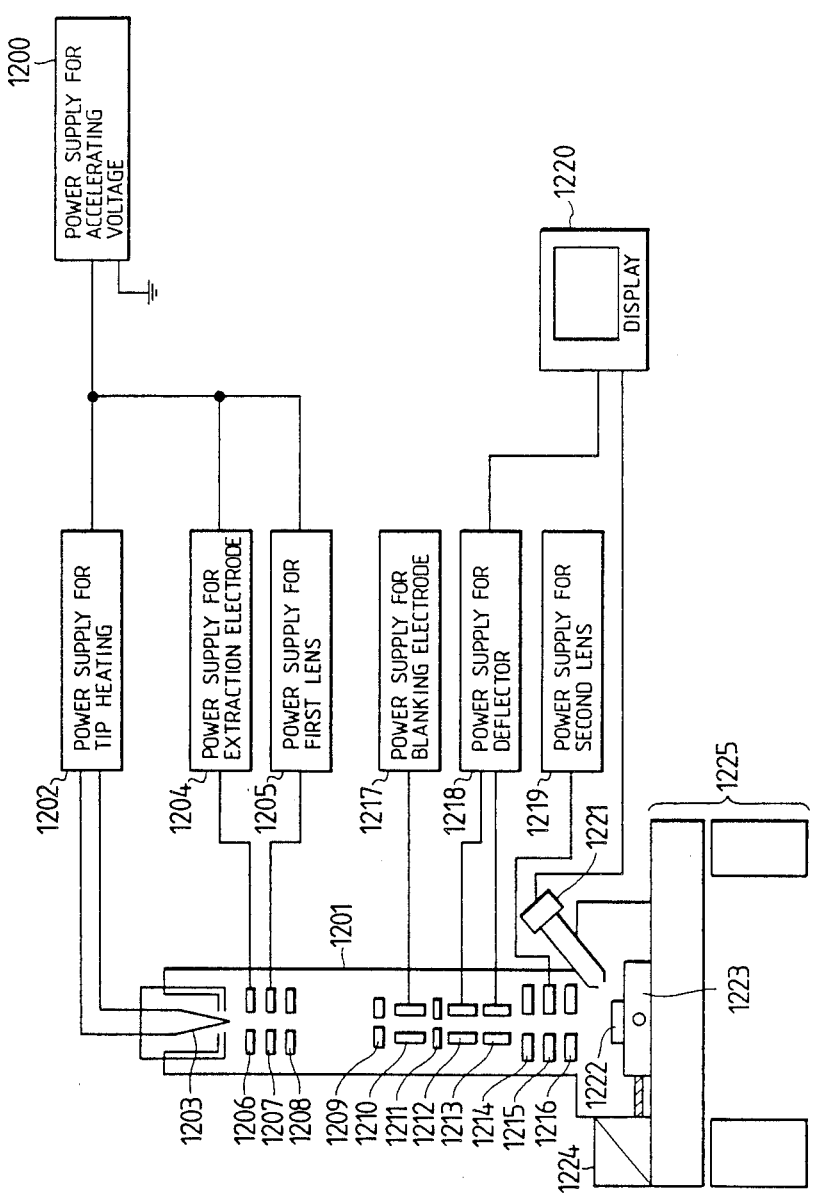
FIGS. 12, 13, 14, 19, 29, 30, 31 and 32 are schematic explanatory diagrams each showing a focused ion beam-processing apparatus which can be used in the present invention.

FIG. 12 shows a focused ion beam-processing apparatus for forming two-dimensional and three-dimensional superlattices according to the present invention. In a vacuum chamber 1201 which is installed on a vibration-proof trestle 1225 and whose interior is held at a vacuum degree of $10^{-6}$ Torr or below, an ion source of high brightness (in the figure, a liquid metal ion source) is energized and heated by a power supply for tip heating 1202 which is floated in correspondence with an accelerating voltage by a power supply for the accelerating voltage, 1200, and an ion beam is extracted from a molten metal deposited to the tip of a filament 1203, by an electric field which is established by an extraction electrode 1206 connected to a power supply for the extraction electrode, 1204. Together with the extraction electrode, electrodes 1207 and 1208 constitute a first electrostatic lens. A power supply for the lens electrode, 1205 delivers a lens voltage which is applied to the lens electrode 1207. The ion beam is rendered a substantially collimated beam by the first lens 1206, 1207, 1208, and has its diameter limited by a beam limiting aperture 1209. Thereafter, the beam passes through a blanking electrode 1210 which is driven by a power supply for the blanking electrode, 1217 and which serves to turn ON/Off the beam at high speed, and then through a blanking aperture 1211, and it is deflected by two deflecting electrodes 1212 and 1213 which are driven by a power supply for a deflector, 1218. Thereafter, the beam enters a second electrostatic lens which is configured of three electrodes 1214, 1215 and 1216. In this case, in the second lens, only the central lens has a voltage applied thereto by a power supply for the second lens, 1219. The ion beam is focused by the second lens so as to bombard a sample 1222 on a sample stage 1223.

A secondary charged particle detector 1221 catches secondary electrons or secondary ions emitted from the sample by the irradiation with the ion beam, amplifies them and displays a scanning ion image on a display 1220 in synchronism with a deflection signal, whereby the sample can be observed. Numeral 1224 indicates a loader for changing samples.

In this apparatus, the two stages of lenses are employed, so that magnifications can be made greater than in a conventional case employing one stage of lens. Accordingly, a sufficiently high current (50 pA-300 pA) can be attained even with satisfactory ultrafine beam (0.1-0.05 $\mu$m), and satisfactory processing and detection can be performed. In addition, while the sample of the superlattice is being detected with such an ultrafine beam, the beam is deflected, whereby the two-dimensional and three-dimensional superlatttices as respectively shown in FIGS. 1a and 1b can be processed.

Next, there will be described an embodiment which is an improvement on the apparatus shown in FIG. 12.

Figure 13:
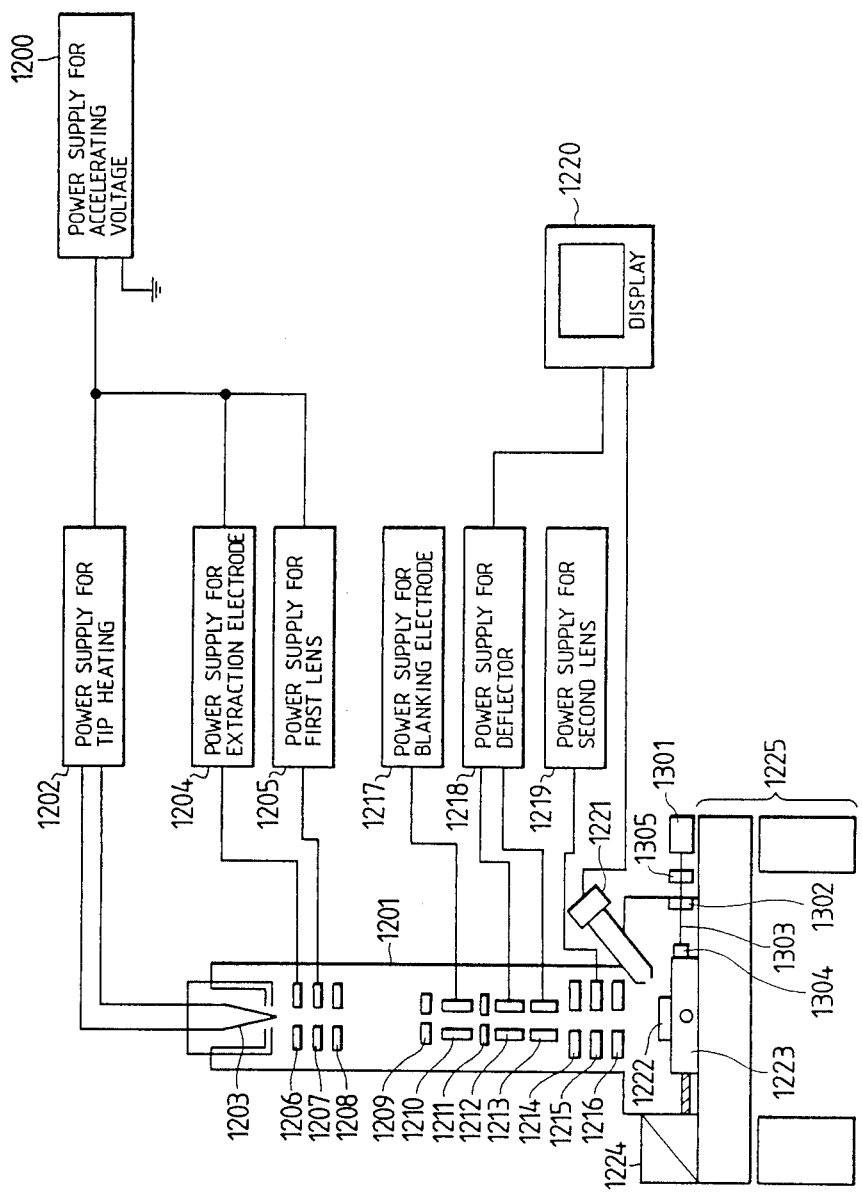

FIG. 13 shows an example of an ion beam-processing apparatus which employs a laser interferometer 1301 in order to enhance the positional accuracy of finishing. A laser beam 1303 from the laser interferometer 1301 passes through an interference prism 1305 and then through a window 1302, and it is reflected by a reflector mirror 1304 mounted on a sample stage 1223, to retrocede along the previous path. Thus, the position of the stage can be detected in the order of 10 nm. Regarding a drift ascribable to temperatures, the drift of an ion beam attributed to the electrification of a sample and an electrostatic optical system by charges, etc., target marks are searched for at regular time intervals, the positions thereof are read by the laser interferometer, and the deflection amounts of the beam are corrected according to the values of the positions, whereby the influences of the drifts can be eliminated, and processing can be carried out at a high accuracy within the order of 10 nm.

Figure 14:
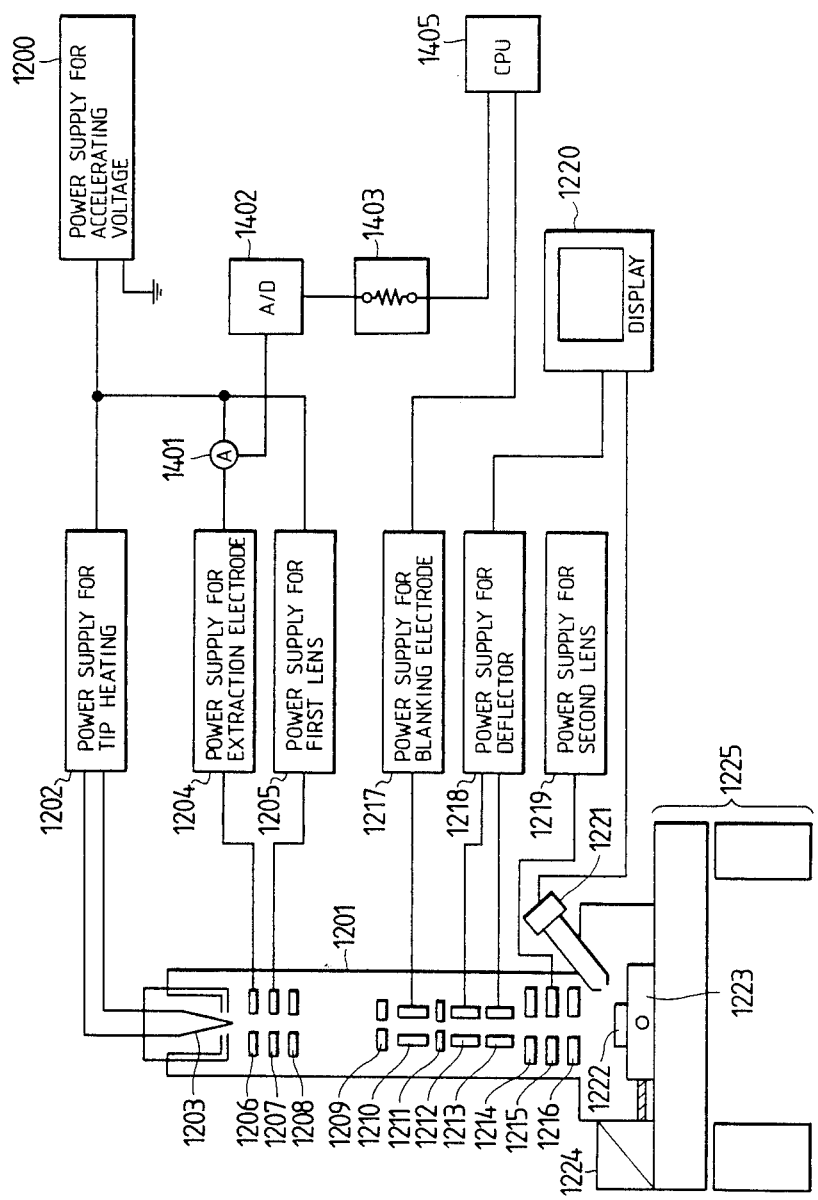

FIG. 14 shows an example of an ion beam-processing apparatus in which, when the current of an ion beam involves drifts, the processing period of time is changed to control the depth of processing.

Figure 15:
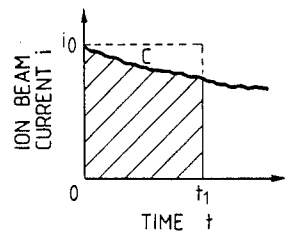
FIG. 15 is a graph showing the ordinary relationship between the ion beam current and the time.

This example is used for solving a problem as stated below:

In FIG. 15, the axis of ordinates represents the ion beam current i, and the axis of abscissas the time t.

Figure 17:
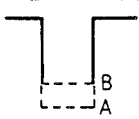
FIG. 17 is a schematic sectional view for explaining an ordinary processed situation in the case where a groove is formed by the projection of an ion beam.

In general, the ion beam current is not always stable, but it often drifts while fluctuating as illustrated in FIG. 15. In case of processing a sample, it is aimed at to process the sample down to a depth A as shown in FIG. 17. A processing period of time $t_1$ is evaluated from a volume to-be-processed $V_o$, an ion beam current $i_o$ and the sputtering rate (or the processing speed coefficient) of the sample to-be-processed. However, when the processing is carried forward and ended at the time $t_1$ without any change, a projected current amounts to $$\int_0^{t_1} i(t) \cdot dt,$$

which is smaller than $i_o \cdot t_1$ by an area C in FIG. 15, so that an actual processing depth B indicated in FIG. 17 becomes shallower. In the apparatus of FIG. 14, therefore, the fluctuations of the ion beam current are compensated in such a way that a current $I_o$ to flow into an extraction electrode 1206 is detected by an ammeter 1401, that a value indicative of the current is converted into a digital signal by an A/D (analog-to-digital) to-digital) converter 1402, and that the digital signal is input to a CPU (central processing unit) 1405 through an optical coupler 1403. The CPU 1405 sequentially calculates:

$$\int i(t) \cdot dt \text{ or } \Sigma i(t) \cdot \Delta t$$

In general, the proportional relationship holds between the current I(t) which flows into the extraction electrode and the ion beam current i(t) which is projected on the sample. Therefore, letting k denote a proportion constant, $$i(t) = k \cdot I(t)$$

holds, on the basis of which the CPU 1405 finds i(t). Besides, it sequentially computes $$\int_0^t i(t) \cdot dt \text{ or } \Sigma i(t) \cdot \Delta t$$

At the point of time $t = t_2$ (in FIG. 16) at which the aforementioned value has become equal to the target value $i_o \cdot t_1$, the CPU 1405 operates a blanking power supply 1217 so as to stop the ion beam current which is projected on the sample.

Figure 16:
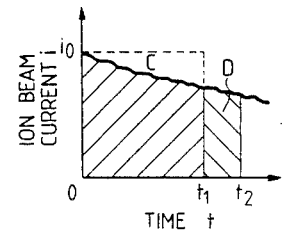
FIG. 16 is a graph showing the improved relationship between the ion beam current and the time.
Figure 18:
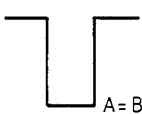
FIG. 18 is a schematic sectional view for explaining an improved processed situation in the case of forming a groove by the ion beam projection.

On this occasion, $$\int_0^{t_2} i(t) \cdot dt = i_o \cdot t_1$$

holds, and an area D FIG. 16:

$$\int_{t_1}^{t_2} i(t) \cdot dt$$

is equal to the area C. In FIG. 18, the processing depth B can be brought into agreement with the target value A at high precision.

Figure 19:
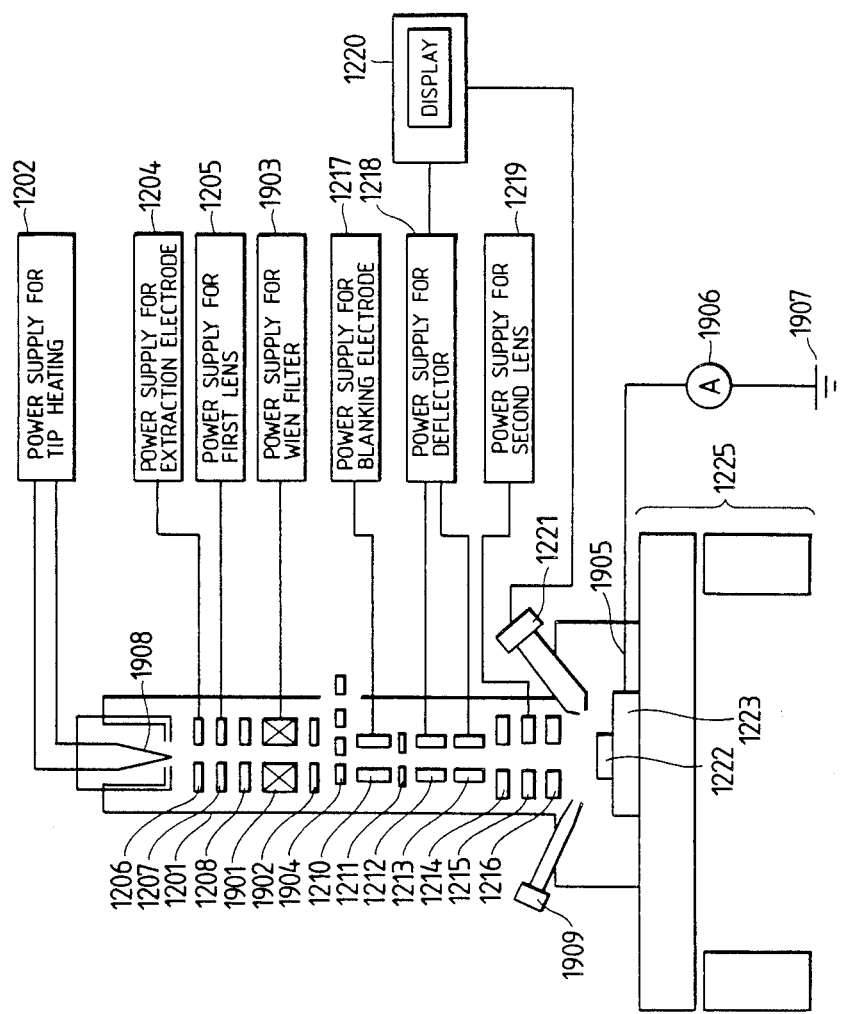

An apparatus shown in FIG. 19 contains a large number of novel features as compared with the foregoing embodiments. First, as an ion source 1908, there is employed any of alloy ion sources of, for example, Au-Si, Au-Si-Be, Al-Si, Pd-Ni-Si-Be-B, Ni-B, and As-P. In addition, a Wien filter 1901 and an aperture for a mass analysis, 1902 are used, and the magnetic field of the Wien filter is changed by changing current which is caused to flow through a coil, whereby an extracted ion beam is passed through the mass analyzing aperture 1902 so as to reach a sample 1222. Numeral 1903 indicates a power supply for the Wien filter. As the species of ions, only corresponding ones can be selected from among the elements of the composition of the alloy.

Figure 20:
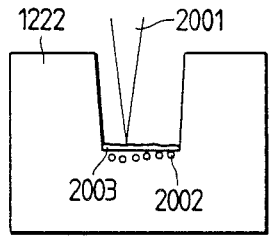
FIGS. 20 and 22 are schematic sectional views for explaining the ordinary situation of a groove which is being formed by an ion beam.

This brings forth an effect as stated below: As illustrated by way of example in FIG. 20, when an ion beam of Ga 2001 is employed as the processing ion source, some 2002 of Ga ions are implanted into the bottom of the hole of a GaAs sample 1222, and excess Ga ions 2003 precipitate granularly on the surface of the sample, so that the characteristics of a superlattice are adversely affected. To cope with this, the embodiment in FIG. 19 derives only As ions from the ions of the As alloy by means of the Wien filter and bombards the sample with the As ions. Thus, the Ga and As ions bombard in amounts corresponding to the composition of the superlattice, whereby the influence on the characteristics in the case of bombardment of Ga ions only can be eliminated.

Figure 21:
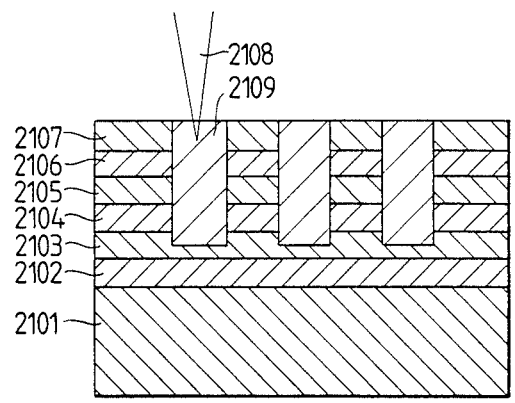
FIG. 21 is a schematic sectional view showing a process for manufacturing a two-dimensional superlattice structure by means of ion implantation in still another embodiment of the present invention.

Moreover, according to this system, a two-dimensional superlattice can be manufactured also by implantation without forming grooves. Such an example is shown in FIG. 21. In a sample in which a GaAs substrate 2101 is overlaid with layers of GaAlAs 2102, GaAs 2103, GaAlAs 2104, GaAs 2105, GaAlAs 2106 and GaAs 2107, an ion beam 2108 of, for example, Si derived from an Au-Si alloy ion source is implanted at an accelerating voltage of 100 kV or above, whereby the implanted part 2109 has its crystal lattice disordered, and using it as a potential barrier, the two-dimensional superlattice (and further, a three-dimensional superlattice) can be manufactured.

Referring back to FIG. 19, a gas nozzle 1909 serves to introduce a gas for ion beam-induced etching or ion beam-induced CVD therefrom and to project the gas on the sample 1222.

Figure 22:
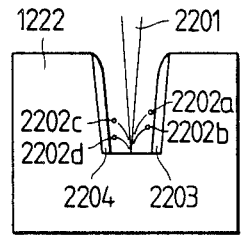

First, there will be explained the case of introducing the gas for ion beam-induced etching from the nozzle. In focused ion beam processing, the walls of a hole formed exist in close proximities to a place to be subjected to sputtering, and hence, there arises the phenomenon that atoms sputtered and removed deposit on the walls in large quantities. Referring to FIG. 22, in case of projecting an ion beam 2201, atoms 2202a, 2202b, 2202c and 2202d are sputtered, and layers 2203 and 2204 are formed by the redeposition of the sputtered atoms to the side walls of a hole.

Figure 23:
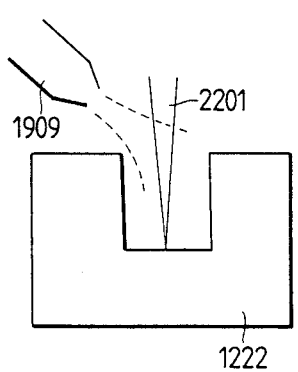
FIG. 23 is a schematic sectional view showing the improved situation of a groove which is being formed by an ion beam process utilizing ion beam-induced etching.

Since the redeposition layers of large amounts of atoms are formed in this manner, there have been such problems that the rate of processing is low, that a processed sectional shape differs depending upon the condition of repeated scanning in the processing (for example, whether a sample 1222 is processed repeatedly a large number of times at a high scanning speed, or it is processed only once at a low scanning speed), etc., and that a perpendicular sectional shape is difficult to be obtained. Therefore, a material such as $Cl_2$ is introduced as an etching gas from the gas nozzle 1909 as shown in FIG. 23, and a processed groove of sharp sectional shape having no redeposition layers as seen from FIG. 23 can be formed at high speed by utilizing the ion beam-induced etching in which, at an ion beam irradiation part, the gas is dissociated by the energy of the ion beam 2201 to couple with the material of the sample 1222 and form a sublimable substance, thereby to etch and remove the sample material.

Figure 24:
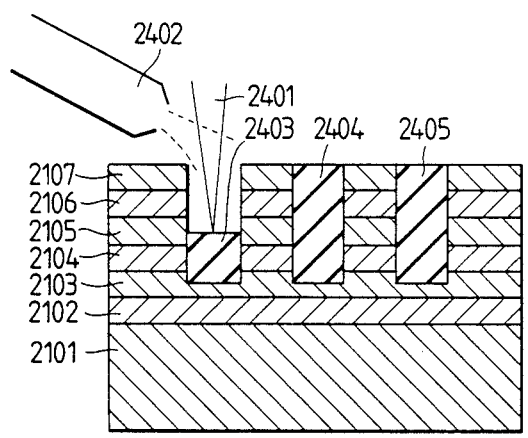
FIG. 24 is a schematic sectional view for explaining a processing step at which an insulator is being deposited into the groove of a two-dimensional superlattice structure by ion beam-induced CVD.

FIG. 24 shows an example of ion beam-induced CVD.

When, in case of manufacturing the two-dimensional or three-dimensional superlattice as shown in FIG. 1a or 1b, the grooves formed are left intact, characteristics as a device are affected by the invasion of foreign matters, the breakdown of the grooves, the oxidation of side walls, the adhesion of moisture, etc. Therefore, while silane $SiH_4$ and oxygen $O_2$ as a gas for CVD are being introduced from a nozzle 2402, an ion beam 2401 bombards a processed groove part. Thus, an $SiO_2$ film 2403 is grown and deposited while Si and $O_2$ are reacting in the part bombarded by the ion beam. In this way, the grooves are filled up with deposition parts 2404 and 2405, and the grooves formed can be protected and stabilized for passivation.

Figure 25:
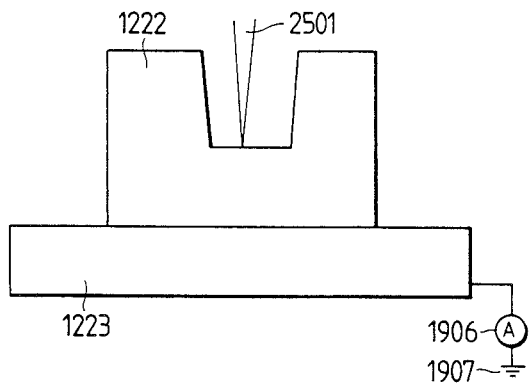
FIG. 25 is an explanatory view showing the monitoring of a step in a process utilizing an ion beam.

In FIG. 19, a cable 1905 from a stage 1223 is taken out of a vacuum chamber 1201 and is connected to a ground point 1907 through a galvanometer 1906. This serves to monitor the process employing the ion beam, and is illustrated in FIG. 25 clearly. Since the ion beam 2501 is the flow of charged particles, the bombardment thereof gives rise to the inflow of current into a substrate, and the current can be detected by the galvanometer 1906. In the case of the removal processing with the ion beam, the detection current fluctuates each time the individual layer (GaAs or GaAlAs) of the superlattice has been removed. Besides, it fluctuates greatly when the GaAs substrate has been finally reached. Thus, the processing depth can be monitored. In particular, the layer down to which the sample has been removed can be known.

Further, in the case of implanting Si as illustrated in FIG. 21, the current to flow to the galvanometer changes according to the amount and depth of the implantation, which can therefore be monitored. Also in the case where the deposition film is formed by the laser CVD as illustrated in FIG. 24, the paths along which the charges flow out to the GaAs/GaAlAs layers of the side walls and the distances of the paths change change according to the deposited thickness of the insulator, so that the current to flow changes. For the above reasons, the thicknesses of the deposited parts can be monitored.

Moreover, the apparatus in FIG. 19 is furnished with a variable aperture 1904. This variable aperture is so constructed that beam limiting apertures of several diameters can be changed-over from outside the vacuum chamber 1201 by the use of vacuum feedthrough. Thus, the diameter of the ion beam to be projected can be changed. The operation is illustrated in FIGS. 26a, 26b, 27a, 27b, 28a and 28b. FIGS. 26a, 27a and 28a correspond to a case of using a large aperture diameter, while FIGS. 26b, 27b and 28b correspond to a case of using a small aperture diameter.

When the large-diameter aperture 2602 of the variable aperture 2601 is used, the ion beam 2604 passes therethrough as a thick beam 2605 and is focused by a second lens 2606 into a large spot 2607 or 2610 having a diameter of, for example, at least 0.2 $\mu$m. Likewise, in the case of FIGS. 26b and 27b, when the variable aperture is changed-over to a small-diameter aperture 2603, a fine beam 2614 passes, and a small spot 2609 or 2611 having a diameter of, for example, at most 0.1 $\mu$m, more preferably 0.05 $\mu$m or less, is obtained.

FIGS. 28a and 28b exemplify the usage of the variable beam diameters. In the case of forming the two-dimensional or three-dimensional quantum well structure shown in FIG. 1a or 1b by the use of the ion beam, when the whole area of the groove is processed by a fine beam, a very long time is required. In order to shorten the processing period of time, therefore, the central part 2612 of the groove to-be-formed of the sample 2608 is first processed by the thick spot, accordingly a great beam current, as illustrated in FIG. 28a. On this occasion, the processing is done at high speed. Since, however, the beam diameter is large, the accuracy of finishing is inferior. Subsequently, the side walls 2613 and bottom 2615 of the hole formed are processed to desired dimensions by the fine spot, accordingly a small beam current. On this occasion, finishing of high accuracy is possible though the processing speed is low, and the sectional shape 2616 of the processed hole at high precision is finally attained.

Owing to such a method of changing-over the variable aperture, the sample can be processed at the same accuracy as, and at a much higher speed than, in the case of using only the fine beam.

Figure 29:
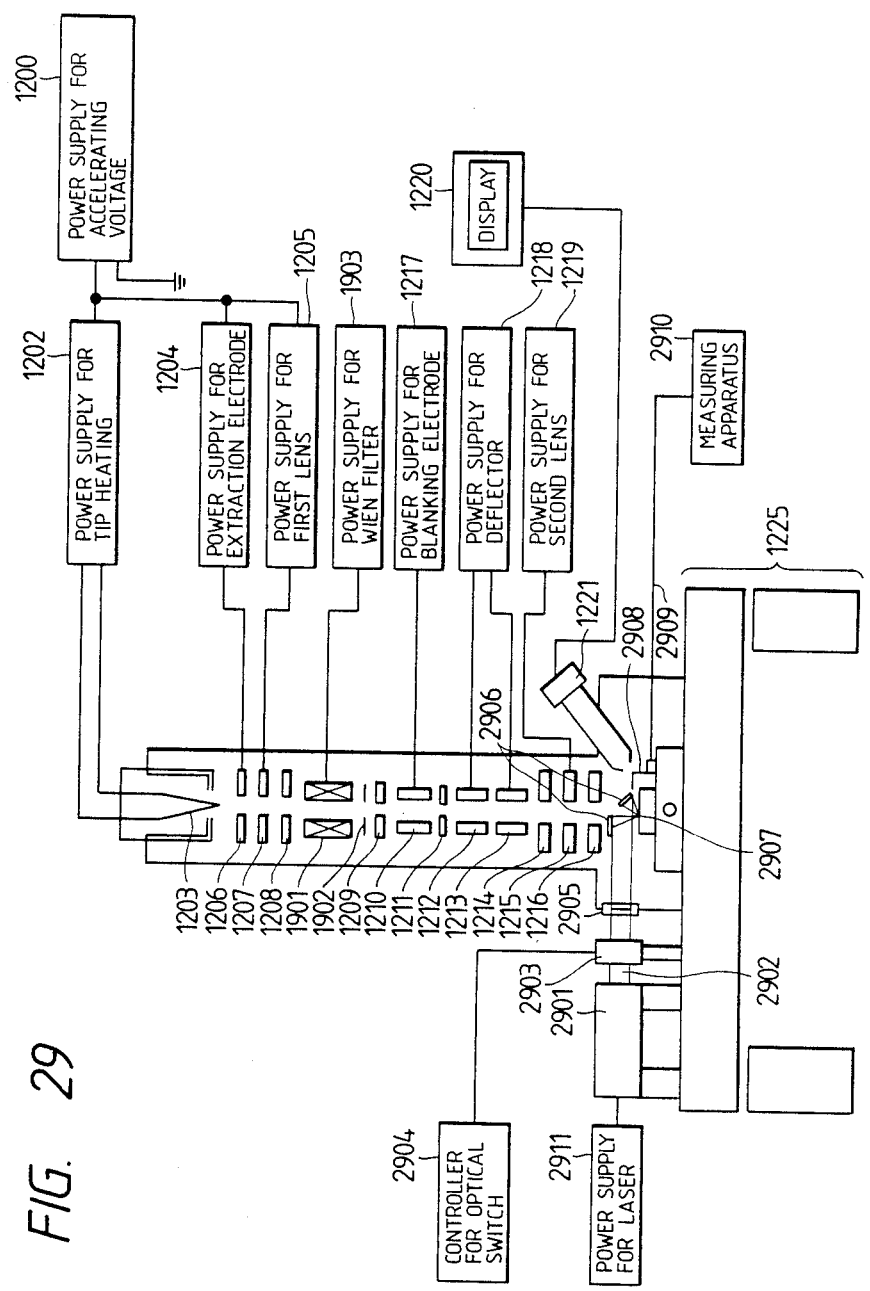

FIG. 29 shows another ion beam apparatus. In this case, a laser beam 2902 emitted from a laser oscillator 2901 is turned on/off by an optical switch 2903 such as acoustooptic device. Thereafter, it passes through a window 2905 and is reflected and focused by a concave reflector 2906, to form a spot 2907 on a sample. Thus, the laser beam can be condensed and projected on an ion beam irradiation part.

In this case, a function as stated below is realized. In general, lattice defects develop in the part irradiated with an ion beam. Therefore, the defective part needs to be remedied for attaining normal optical and electrical characteristics. However, annealing based on heating in a high-temperature oven requires a long time and exerts serious influences on the various parts of a device. It is therefore greatly effective that the in-situ annealing is performed within a vacuum chamber by projecting the laser beam on only the required places as described above.

With the laser 2901, as regards a device which is fabricated by an ion beam, current caused to flow by the laser projection is derived via a conductor 2909 by touching a probe 2908 to an electrode formed on the device and is measured by a measuring apparatus 2910, whereby characteristics can be inspected in-line fashion, in other words, while the ion beam processing is being performed within the processing apparatus or immediately after the processing has been done.

In FIG. 29, numeral 2904 indicates a controller for the optical switch 2903, and numeral 2911 a power supply for the laser 2901.

Figure 30:
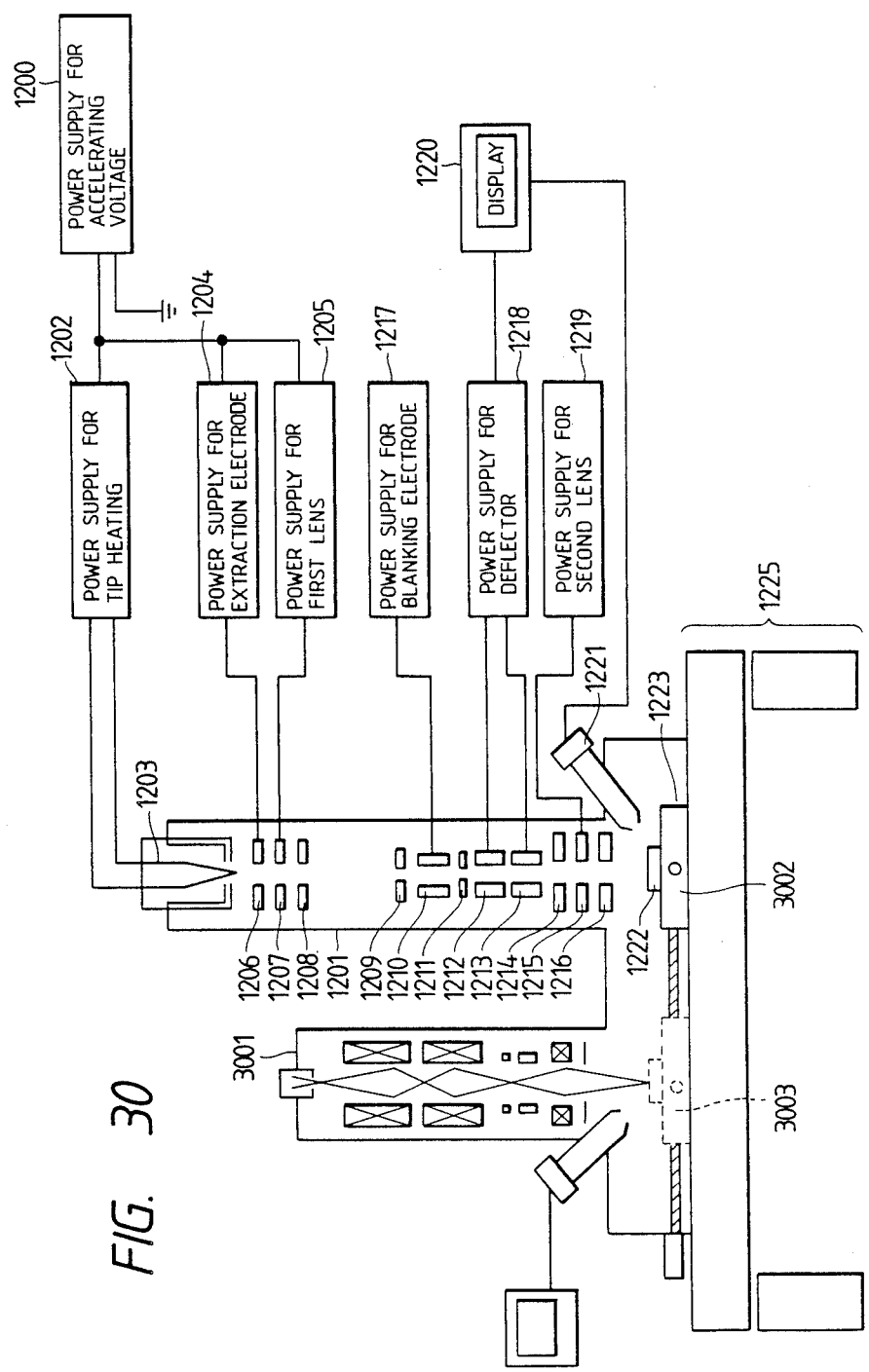

FIG. 30 shows an example of an ion beam apparatus in which an SEM (scanning electron microscope) 3001 is installed within an identical chamber. After a sample 1222 has been processed, implanted with ions or formed with a CVD film by an ion beam, a sample stage 3002 is moved to the position 3003 of the SEM, whereby an in-situ observation can be performed. Besides, using the electron beam of the SEM, parts having defects can be remedied by electron beam annealing.

Figure 31:
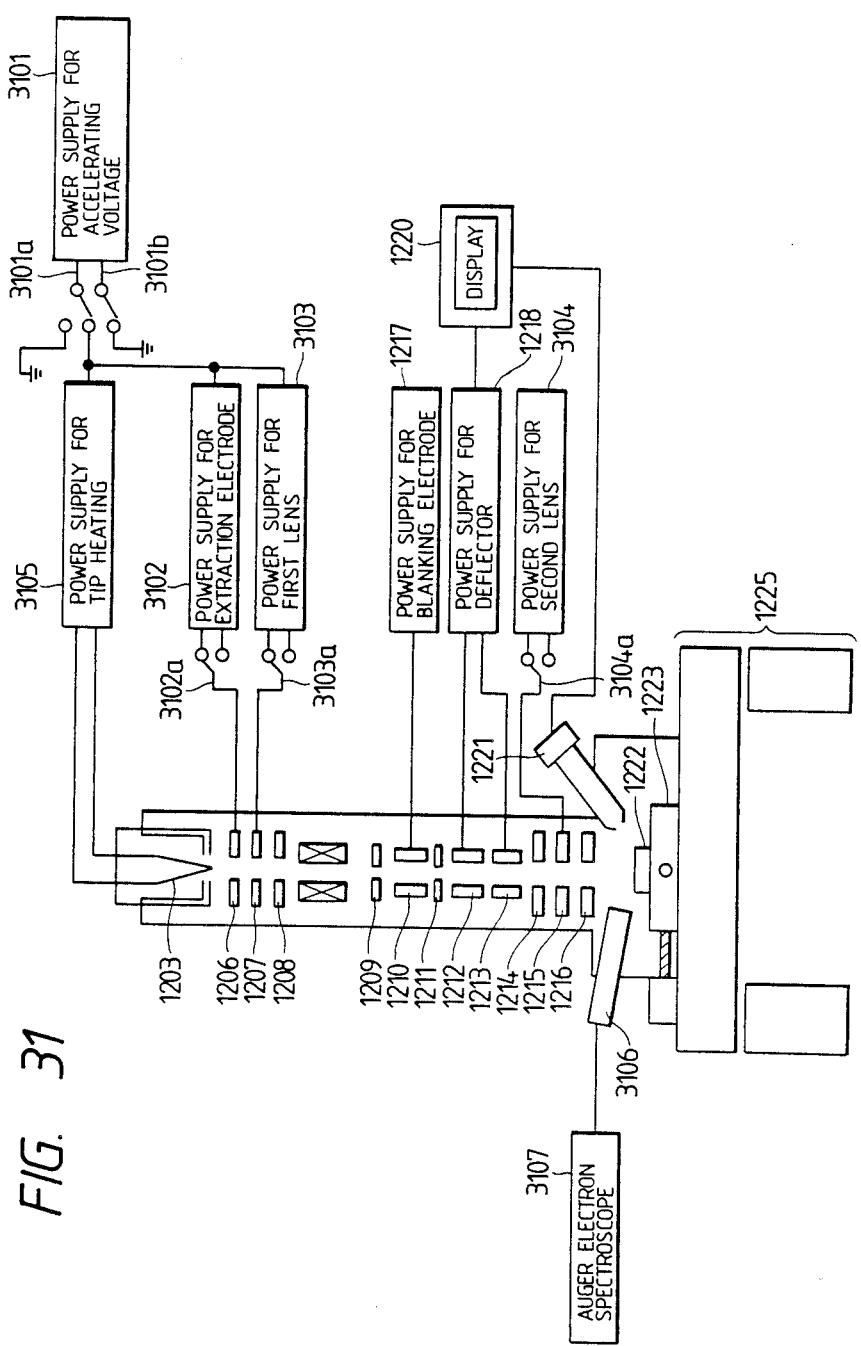

FIG. 31 shows an ion beam apparatus in which the installation of the SEM as stated above is replaced with the application of an electron-ion hybrid source for extracting electrons and ions from the identical source. With this measure, depending upon whether the extraction voltage of the ion source is set to be plus or minus, either the electrons or the ions can be switchedly derived from the tip of a conical protuberance which a liquid metal at the tip of an ion source needle forms owing to the balance between a surface tension and an electrostatic force. To this end, a power supply for an accelerating voltage, 3101 connects a ground terminal and a high voltage output terminal to either of a power supply for tip heating 3105 or an earth point through transfer switches 3101a and 3101b, whereby it can be changed-over so as to generate either a plus accelerating voltage or a minus accelerating voltage. Regarding each of a power supply for an extraction electrode, 3102, a power supply for a first lens, 3103 and a power supply for a second lens, 3104, power sources of both plus and minus outputs are employed, whereby the output to the corresponding electrode can be set plus or minus through a corresponding transfer switch 3102a, 3103a or 3104a.

Thus, after processing (implantation or CVD) with an ion beam, the voltages are changed-over in the processed state so as to derive an electron beam, with which an observation based on an SEM image can be performed. It is also possible to sequentially observe a sample in the course of the processing or implantation.

Besides, in the apparatus of FIG. 31, Auger electrons emitted from the sample 1222 can be detected by an energy analyzer 3106, and an in-situ analysis (Auger microspectroscopy) is performed by an Auger electron spectroscope 3107. It is also possible to locally heat the sample with the electron beam, thereby to perform electron beam annealing for remedying defects ascribable to the projection of the ion beam.

Figure 32:
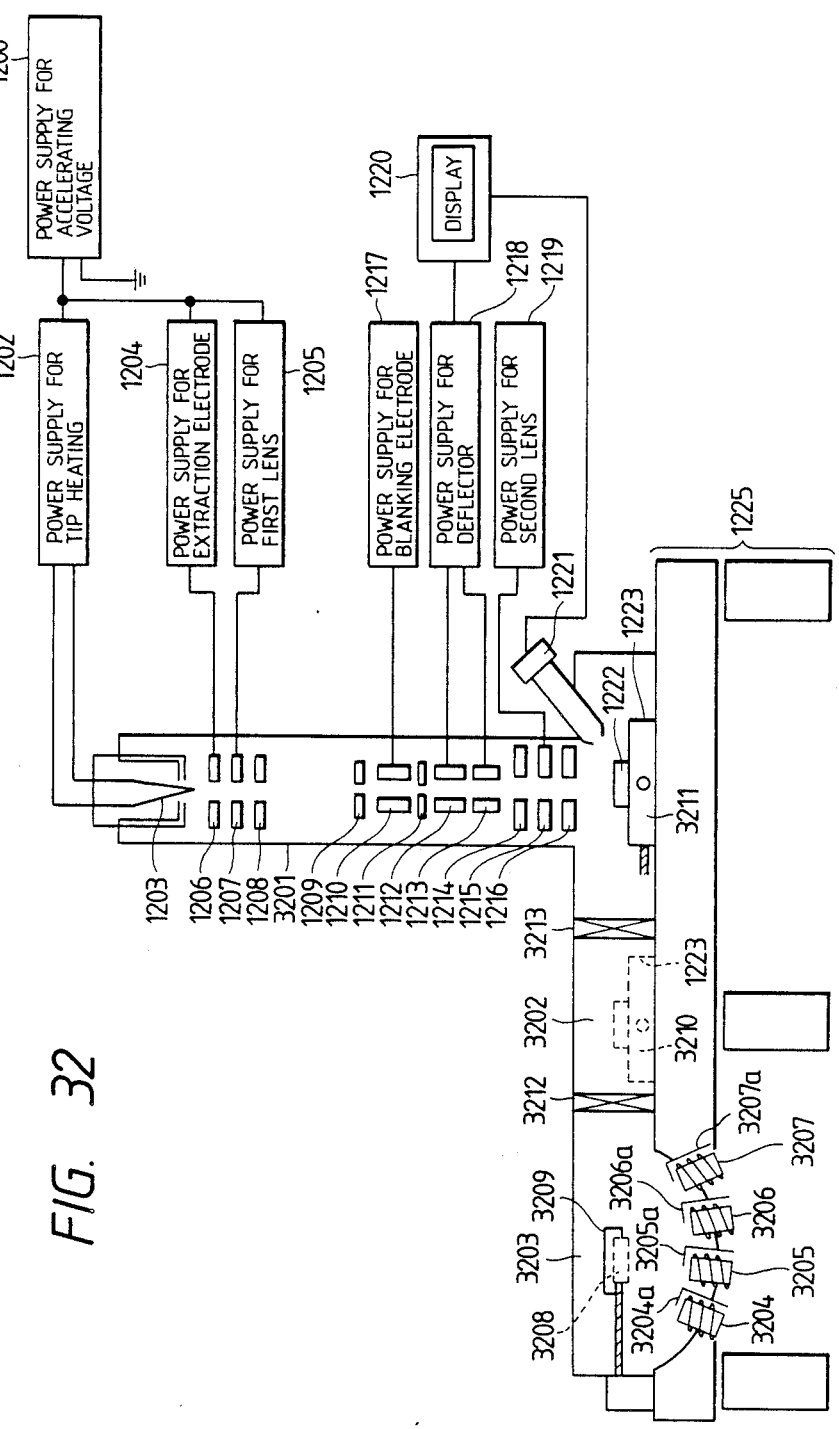

FIG. 32 shows an example of an apparatus in which a chamber 3201 for a highly-focused ion beam and a chamber 3203 for MBE (molecular beam epitaxy) are coupled through a chamber 3202 as a sample exchange mechanism portion. In the MBE chamber 3203 of ultrahigh vacuum degree, a sample 3208 is set on a holder 3209 in a manner to face downwards, and molecular beams (of, for example, Ga, As, Al and Si) spurted from cells 3204, 3205, 3206 and 3207 round which heaters are wound are successively or simultaneously evaporated on the sample 3208. The respective cells are provided with shutters 3204a, 3205a, 3206a and 3207a, which pass or shut the molecular beams of the corresponding materials. In this way, a one-dimensional superlattice is formed. The sample holder 3209 is inverted by a sample exchange mechanism in the chamber 3202, and the sample is set on a sample stage 1223 at a position 3210. Then, the stage 1223 is moved to the position 3211 of an electron-ion hybrid beam portion. Since, in this case, the three chambers 3203, 3202 and 3201 have vacuum degrees unequal to one another, gate valves 3212 and 3213 are interposed between the adjacent chambers. When the sample is moved for exchange, the valves are opened and closed, and the chambers are evacuated. The electron-ion hybrid beam portion is the same as in FIG. 31, and it makes it possible to perform processing, implantation and CVD with an ion beam and SEM observation and annealing with an electron beam and to analyze a film owing to Auger electron spectroscopy.

Since, with this apparatus, the film formation and the analysis can be carried out within the vacuum equipment, the problems of contamination, oxidation etc. in the case of taking out the sample into the atmospheric air are not involved unlike the use of separate equipment, to bring forth the great merit that the sample can be subjected to the processing, implantation, CVD, analysis and annealing with its surface held clean.

As understood from the foregoing embodiments, the present invention has provided expedients which eliminate the disadvantages of the prior-art techniques and which manufacture two-dimensional and three-dimensional quantum well structures with ease and at high precision.

Besides, it has provided expedients which can vary the pitch, spacing, width and depth of grooves as desired in conformity with purposes and which can form the intervals of wells in a submicron dimension at high precision.

According to the present invention, devices such as a HEMT and a ULSI (ultralarge scale integrated circuit) can be turned into multidimensional superlattices, and the characteristics thereof can be sharply enhanced.

Throughout the drawings, the same numerals and symbols indicate identical portions.

What is claimed is:

1. A method of manufacturing a device of superlattice structure, comprising:
   (i) the step of preparing a one-dimensional superlattice structure in which well layers and potential barrier layers are alternately stacked;
   (ii) the step of generating a focused ion beam; and
   (iii) the step of bombarding the superlattice layers of said one-dimensional superlattice structure by said ion beam, and scanning said ion beam rectilinearly in a direction of said superlattice layers, so as to form at least two parallel grooves by the bombardment of the scanned ion beam, thereby to provide potential barrier layers.

2. A method of manufacturing a device of superlattice structure as defined in claim 1, wherein the one-dimensional superlattice structure is provided on a substrate, and the two parallel grooves are formed by the bombardment of the scanned ion beam to extend to the substrate.

3. A method of manufacturing a device of superlattice structure as defined in claim 1, wherein the ions of the focused ion beam are selected from the group consisting of Ga, In, Si, Sn, Bi, Pb, Ni, Al, Au, Cu, AuSiBe, AlSi, PdNiSiBeB, CuP, SnPbAs, AuSb and AuSi.

4. A method of manufacturing a device of superlattice structure as defined in claim 1, wherein the focused ion beam has a spot diameter of at most 0.5 m.

5. A method of manufacturing a device of superlattice structure as defined in claim 1, wherein said ion beam is focused into a diameter of at most 0.1 m 6. A method of manufacturing a device of superlattice structure as defined in claim 1, wherein said ion beam bombards substantially perpendicularly to said superlattice layers.

7. A method of manufacturing a device of superlattice structure as defined in claim 1, further comprising the step of introducing reactive gas to said one-dimensional superlattice structure, said step of forming said grooves utilizing ion beam-induced etching in which said reactive gas is dissociated by energy of said ion beam to couple with said superlattice structure.

8. A method of manufacturing a device of superlattice structure as defined in claim 1, further comprising the step of annealing said grooves by irradiating with an energy beam so as to remedy defects ascribable to the bombardment of said ion beam.

9. A method of manufacturing a device of superlattice structure as defined in claim 1, further comprising the step of detecting ion beam current of said ion beam, and the step of controlling depth of said grooves in accordance with ion beam current being detected.

10. A method of manufacturing a device of superlattice structure as defined in claim 1, further comprising the step of selecting said ion beam from a composition of alloy ion which is generated from an alloy ion source.

11. A method of manufacturing a device of superlattice structure as defined in claim 1, further comprising the step of observing or analyzing said superlattice structure by detecting charged particles generated from said superlattice structure when an energy beam irradiates the structure.

12. A method of manufacturing a device of superlattice structure as defined in claim 1, further comprising the step of inspecting characteristics of said device of superlattice structure by detecting current flowing through the superlattice structure when an energy beam irradiates the structure.

13. A method of manufacturing a device of superlattice structure as defined in claim 1, wherein said step of forming said grooves has a high speed processing sub-step and a high accuracy processing sub-step, respectively performed by changing said focused ion beam from a broad spot to a fine spot.

14. A method of manufacturing a device of superlattice structure as defined in claim 1, further comprising the step of depositing a desired material into said at least two parallel grooves by energy beam-induced CVD, thereby to form deposition parts.

15. A method of manufacturing a device of superlattice structure as defined in claim 14, wherein said desired material is an insulating material.

16. A method of manufacturing a device of superlattice structure, comprising:
 (i) the step of preparing a one-dimensional superlattice structure in which well layers and potential barrier layers are alternately stacked;
 (ii) the step of generating a focused ion beam; and
 (iii) the step of bombarding the superlattice layers of said one-dimensional superlattice structure by said ion beam, and scanning said ion beam rectilinearly in a direction of said superlattice layers, so as to form at least two parallel grooves, and at least two grooves orthogonal to said parallel grooves, by bombardment of the scanned ion beam, thereby to provide potential barrier layers.

17. A method of manufacturing a device of superlattice structure as defined in claim 16, further comprising the step of depositing an insulator into said at least two parallel grooves and said at least two grooves orthogonal to said parallel grooves.

18. A method of manufacturing a device of superlattice structure as defined in claim 15, wherein said insulator is deposited by ion beam-induced chemical vapor deposition.

19. A method of manufacturing a device of superlattice structure as defined in claim 16, wherein said ion beam is focused into a diameter of at most 0.1 m.

20. A method of manufacturing a device of superlattice structure as defined in claim 16, wherein said ion beam bombards substantially perpendicularly to said superlattice structure.

21. A method of manufacturing a device of superlattice structure as defined in claim 16, further comprising the step of introducing reactive gas to said one-dimensional superlattice structure, said step of forming said grooves utilizing ion beam-induced etching in which said reactive gas is dissociated by energy of said ion beam to couple with said superlattice structure.

22. A method of manufacturing a device of superlattice structure as defined in claim 16, further comprising the step of annealing said grooves by irradiating with an energy beam so as to remedy defects ascribable to the bombardment of said ion beam.

23. A method of manufacturing a device of superlattice structure as defined in claim 16, further comprising the step of detecting ion beam current of said ion beam, and the step of controlling depth of said grooves in accordance with said ion beam current being detected.

24. A method of manufacturing a device of superlattice structure as defined in claim 16, further comprising the step of selecting said ion beam from a composition of alloy ion which is generated from an alloy ion source.

25. A method of manufacturing a device of superlattice structure as defined in claim 16, further comprising the step of observing or analyzing said superlattice structure by detecting charged particles generated from said superlattice structure when an energy beam irradiates the structure.

26. A method of manufacturing a device of superlattice structure as defined in claim 16, further comprising the step of inspecting characteristics of said device of superlattice structure by detecting current flowing through the superlattice structure when an energy beam irradiates the structure.

27. A method of manufacturing a device of superlattice structure as defined in claim 16, wherein said step of forming said grooves has a high speed processing sub-step and a high accuracy processing sub-step, respectively by changing said focused ion beam from a broad spot to a fine spot.

* * * * *